US006627513B1

United States Patent
Tsai et al.

(10) Patent No.: US 6,627,513 B1
(45) Date of Patent: Sep. 30, 2003

(54) METHOD OF MEASURING RESISTANCE IN DEEP TRENCH

(75) Inventors: Tzu-Chin Tsai, Taichung Hsien (TW); Liang-Hsin Chen, Fenshang (TW)

(73) Assignee: NanyaTechnology Corporation, Taoyuan (TW)

( * ) Notice: Subject to any disclaimer, the term of this patent is extended or adjusted under 35 U.S.C. 154(b) by 0 days.

(21) Appl. No.: 10/271,598

(22) Filed: Oct. 15, 2002

(30) Foreign Application Priority Data

Jul. 15, 2002 (TW) ........................................ 91115731 A

(51) Int. Cl.⁷ ........................... H01L 21/76; H01L 21/44
(52) U.S. Cl. ........................ 438/430; 438/675; 438/745; 438/756
(58) Field of Search ............................ 438/745, 756, 438/12, 430, 699, 754, 755, 648, 643, 647, 675; 257/301, 304, 306, 296, 299

(56) References Cited

U.S. PATENT DOCUMENTS

| 4,905,065 | A | * | 2/1990 | Selcuk et al. | 257/301 |
| 5,223,726 | A | * | 6/1993 | Yamada et al. | 257/244 |
| 5,571,738 | A | * | 11/1996 | Krivokapic | 438/291 |
| 5,770,484 | A | * | 6/1998 | Kleinhenz | 438/155 |
| 5,789,769 | A | * | 8/1998 | Yamazaki | 257/263 |
| 5,966,598 | A | * | 10/1999 | Yamazaki | 438/221 |
| 6,037,202 | A | * | 3/2000 | Witek | 438/212 |
| 6,087,253 | A | * | 7/2000 | Liaw | 438/648 |
| 6,184,548 | B1 | * | 2/2001 | Chi et al. | 257/301 |
| 6,333,274 | B2 | * | 12/2001 | Akatsu et al. | 438/745 |
| 6,509,599 | B1 | * | 1/2003 | Wurster et al. | 257/301 |

* cited by examiner

*Primary Examiner*—Michael S. Lebentritt
(74) *Attorney, Agent, or Firm*—Merchant & Gould P.C.

(57) ABSTRACT

A method of measuring resistance in a deep trench. A first substrate having a first trench with a first depth is provided. A first collar insulating layer is formed on the sidewall of the first trench. A first polysilicon layer is formed in the first trench and on the first substrate to obtain a first polysilicon plug in the first trench. The first polysilicon layer and the first substrate are doped with impurity ions, and a first N well is formed in the first substrate. The above procedures are repeated to obtain a second substrate having a second trench with a second depth not equal to the first depth. A voltage is applied to the first and second substrates respectively to obtain a first total resistance of the first substrate and a second total resistance of the second substrate. Finally, the first total resistance and second total resistance are converted by calculation to obtain a resistance of the first polysilicon plug and a resistance of the second polysilicon plug.

10 Claims, 4 Drawing Sheets

METHOD OF MEASURING RESISTANCE IN DEEP TRENCH

BACKGROUND OF THE INVENTION

1. Field of the Invention

The present invention relates to a method of measuring polysilicon resistance, and more particularly to a method of measuring polysilicon resistance in a deep trench.

2. Description of the Prior Art

Presently, dynamic random access memory (DRAM) is widely used. The capacitor in DRAM includes two electrode plates and an insulating material therebetween. The charge storage ability of the capacitor is determined by the thickness of insulating material, the surface area of electrode plates, and electrical properties of insulating material. With the demand for highly integrated circuits and decreased critical dimension, the surface area of memory cell must be decreased, such that a large amount of memory cells can be accommodated in integrated circuits. However, the electrode plate of capacitor must has sufficient surface area to store sufficient charge. Therefore, deep trench type capacitors, which have larger surface area, have been extensively used in DRAM.

FIG. 1 shows a cross-section of a conventional trench capacitor. A pad structure 12 is formed on a silicon substrate 10. A trench 18 is formed in the substrate 10, and a collar oxide 20 is formed on the inner walls of the trench 18. A first polysilicon layer 22 (6 µm), a second polysilicon layer 24 (1 µm), and a third polysilicon layer 26 (1500 Å) are in the trench 18. The trench capacitor further includes an inner electrode 28 and a capacitor dielectric layer 30.

Conventionally, the polysilicon resistance is measured by directly measuring polysilicon on a wafer using the four point probe method. However, the resistance of polysilicon in a deep trench cannot be known. Also, the relationship between the polysilicon resistance in the deep trench and the doping dosage cannot be known. The polysilicon resistance in the deep trench affects the refresh speed of capacitor, which in turn affects the device efficiency. Therefore, there is a need to develop a method for measuring the polysilicon resistance in a deep trench.

SUMMARY OF THE INVENTION

The object of the present invention is to provide a method of measuring resistance in a deep trench using the presently used deep trench short loop. The inventive measurement method measures the resistance of polysilicon plug in a deep trench and resistance of polysilicon pad.

To achieve the above-mentioned object, the method of measuring resistance in a deep trench includes the following steps. A first substrate having a first pad structure and a first trench with a first depth is provided. A first collar insulating layer is formed on the sidewall of the first trench. A first polysilicon layer is formed in the first trench and on the first substrate, wherein the first polysilicon layer includes a first polysilicon pad on the first pad structure and a first polysilicon plug in the first trench. The first polysilicon layer and the first substrate are doped with impurity ions. A first N well is formed in the first substrate by doping with impurity ions. A second substrate having a second pad structure and a second trench with a second depth is provided, wherein the second depth is not equal to the first depth. A second collar insulating layer is formed on the sidewall of the second trench. A second polysilicon layer is formed in the second trench and on the second substrate, wherein the second polysilicon layer includes a second polysilicon pad on the second pad structure and a second polysilicon plug in the second trench. The second polysilicon layer and the second substrate are doped with impurity ions. A second N well is formed in the second substrate by doping with impurity ions. A voltage is applied to the first and second substrates respectively to obtain a first total resistance of the first substrate and a second total resistance of the second substrate. Finally, the first total resistance and second total resistance are converted by calculation to obtain a resistance of the first polysilicon plug and a resistance of the second polysilicon plug.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 2A to 2D shows cross-sections illustrating the process flow of measuring resistance of a deep trench according to an embodiment of the present invention.

Figure 1:
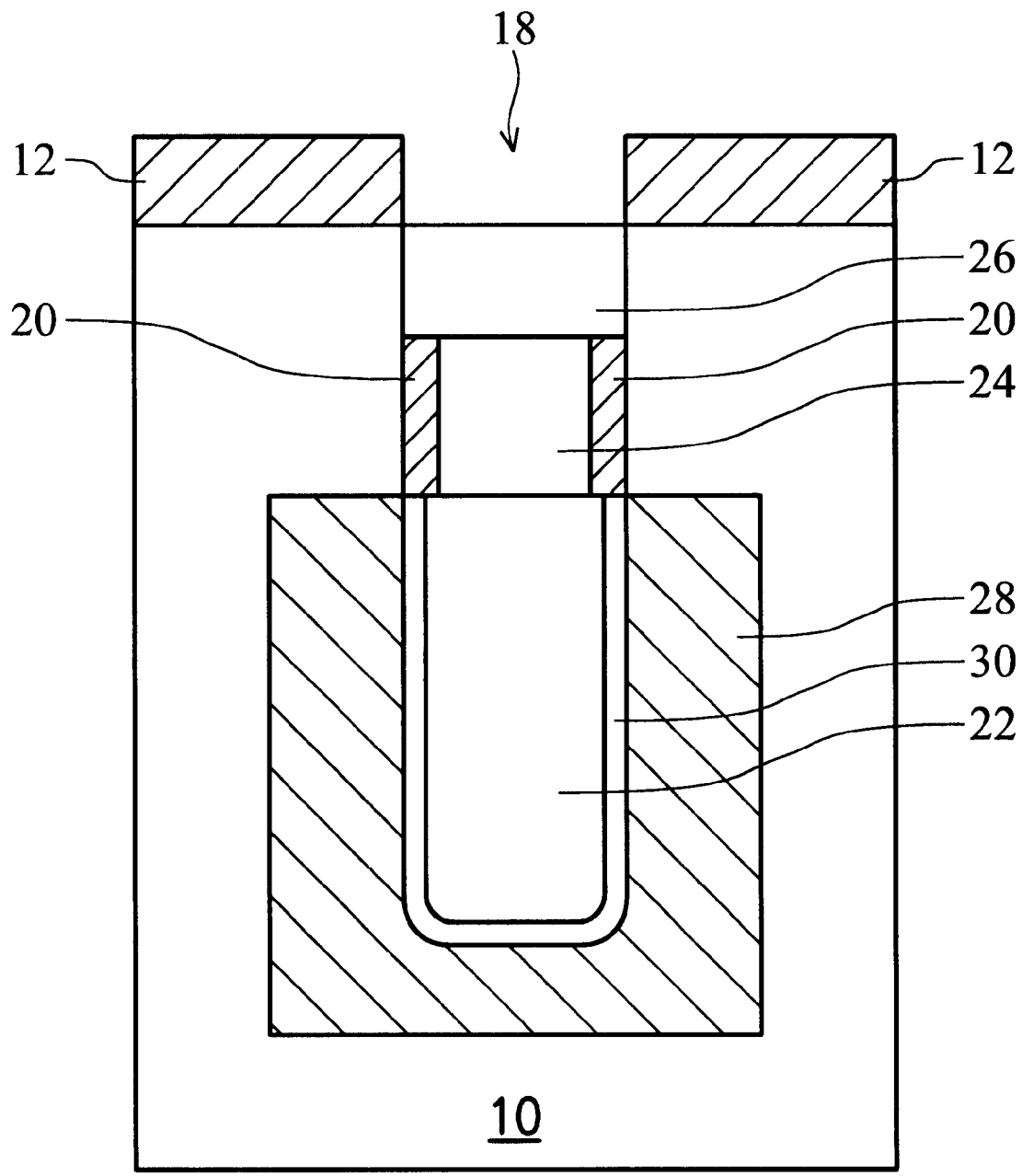
FIG. 1 is a cross-section of a conventional trench capacitor.
Figure 2A:
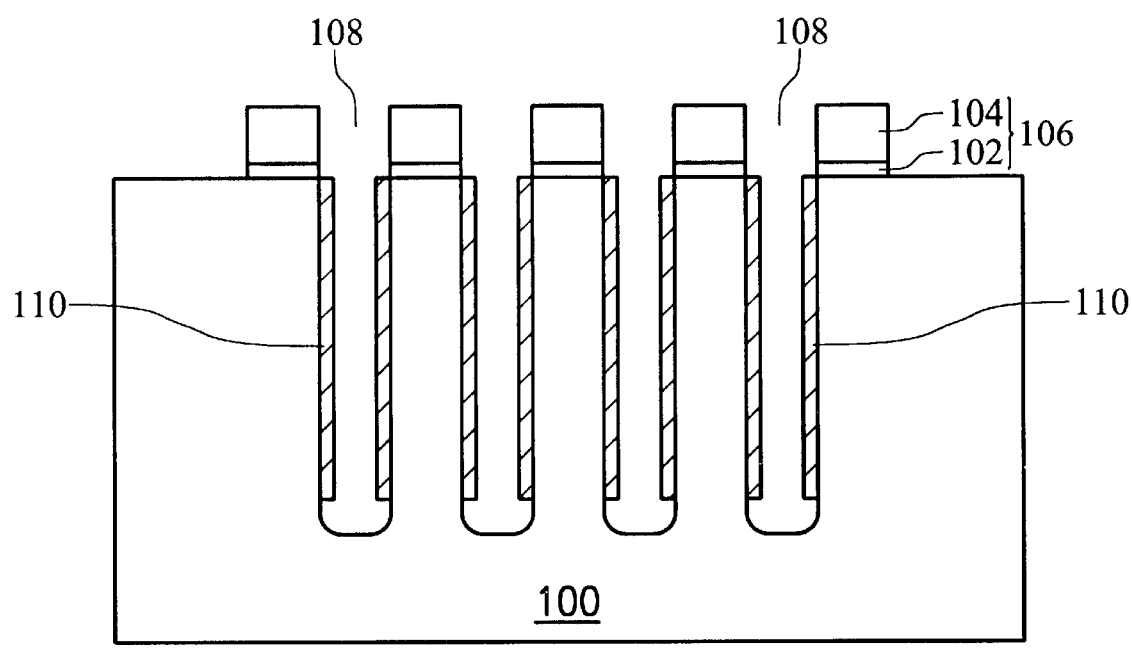
FIGS. 2A to 2D shows cross-sections illustrating the process flow of measuring resistance in a deep trench according to an embodiment of the present invention.

First, referring to FIG. 2A, a pad structure 106 including a nitride layer 104 and a pad oxide layer 102 is formed on a subtrate 100 (such as silicon). For example, a pad oxide layer 102 is formed by thermal oxidation to a thickness of 100 Å. Second, a nitride layer 104 is formed by chemical vapor deposition (CVD) on the pad oxide layer 102. Next, a photoresist pattern (not shown) is formed on the nitride layer 104. Next, the nitride layer 104 and the underlying pad oxide layer 102 are etched using the photoresist pattern as a mask, forming a pad structure 106 including the nitride layer 104 and the pad oxide layer 102. Next, the substrate 100 is etched using the pad structure 106 as a mask to form a trench 108. Etching can be conducted by reactive ion etching (RIE). Next, the photoresist pattern is removed and a structure shown in FIG. 2A is thus formed. Next, a collar insulating layer 110 is formed on the inner sidewall of the trench 108. For example, a collar oxide layer is formed by CVD or thermal oxidation. Next, the bottom of the collar oxide layer is removed, by etching, for example, by dry etching. Thus, the collar oxide layer 110 is formed.

Figure 2B:
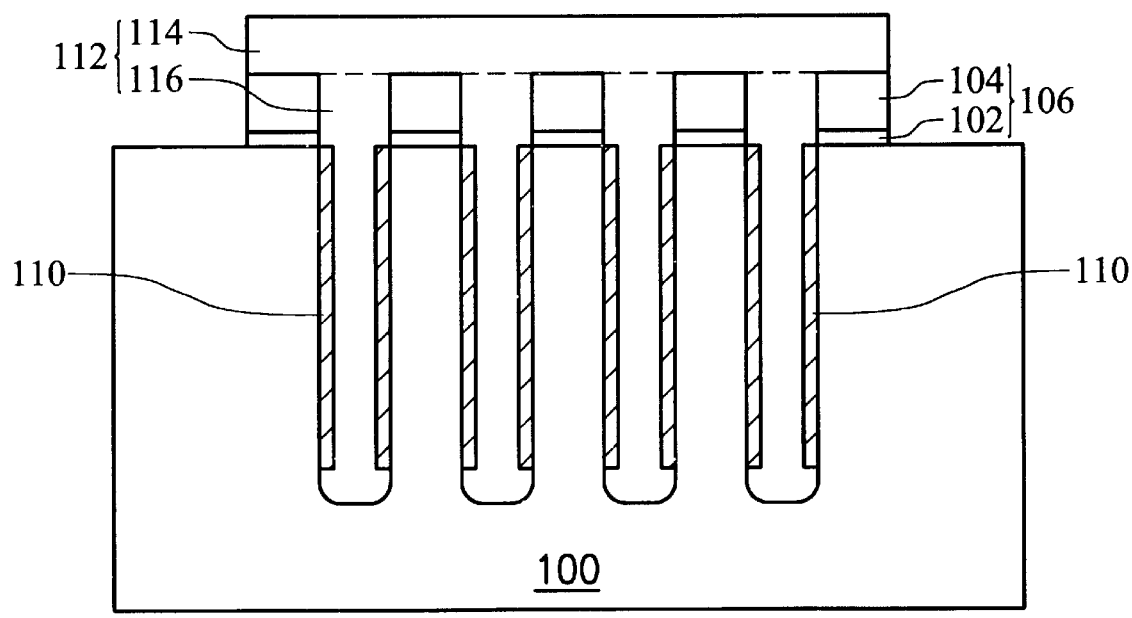

Subsequently, referring to FIG. 2B, a polysilicon layer 112 is formed in the trench 108 and on the semiconductor substrate 100 to the upper portion of the pad structure 106. The polysilicon layer 112 on the pad structure 106 has a thickness of about 3000 Å. The polysilicon layer 112 includes a polysilicon pad 114 on the pad structure 106 and a polysilicon plug 116 in the trench 108.

Figure 2C:
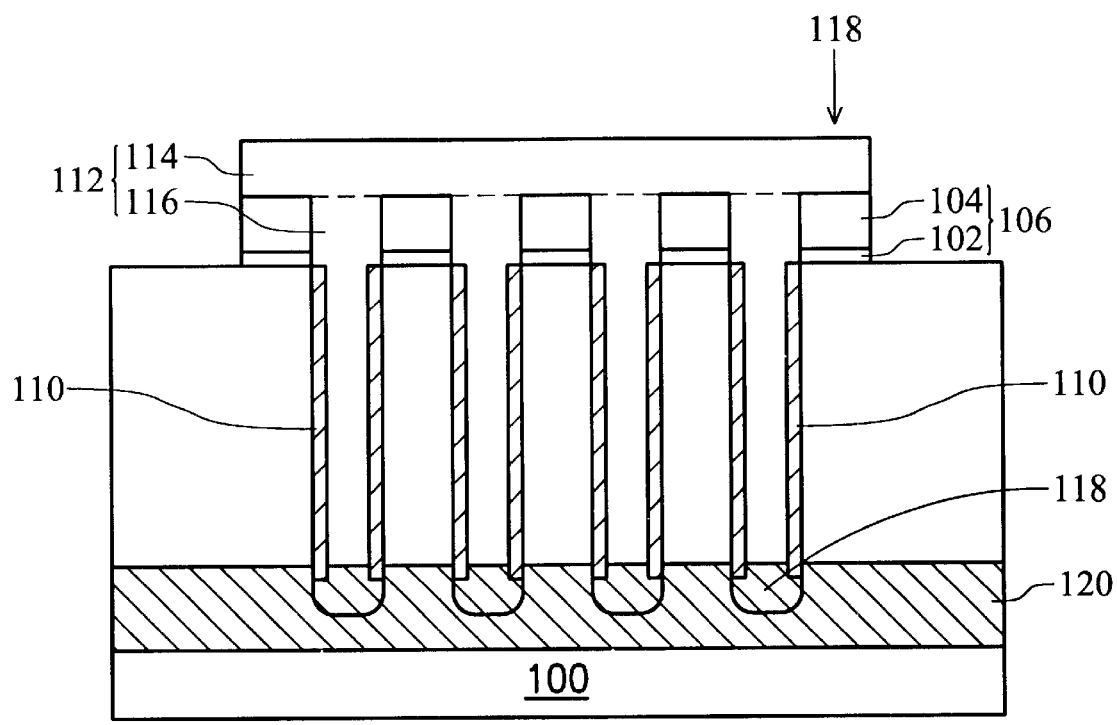

Subsequently, referring to FIG. 2C, the polysilicon layer 112 and the semiconductor substrate 100 are doped with impurity ions, such that the polysilicon layer 112 forms a first electrode 118 and the semiconductor substrate 100 forms a second electrode 120. Thus, a deep trench short loop is formed between the two electrodes. Doping can be performed by ion implantation. For example, impurity ions such as phosphorus ions or arsenic ions are implanted at an energy of 700 to 800 KeV.

Figure 2D:
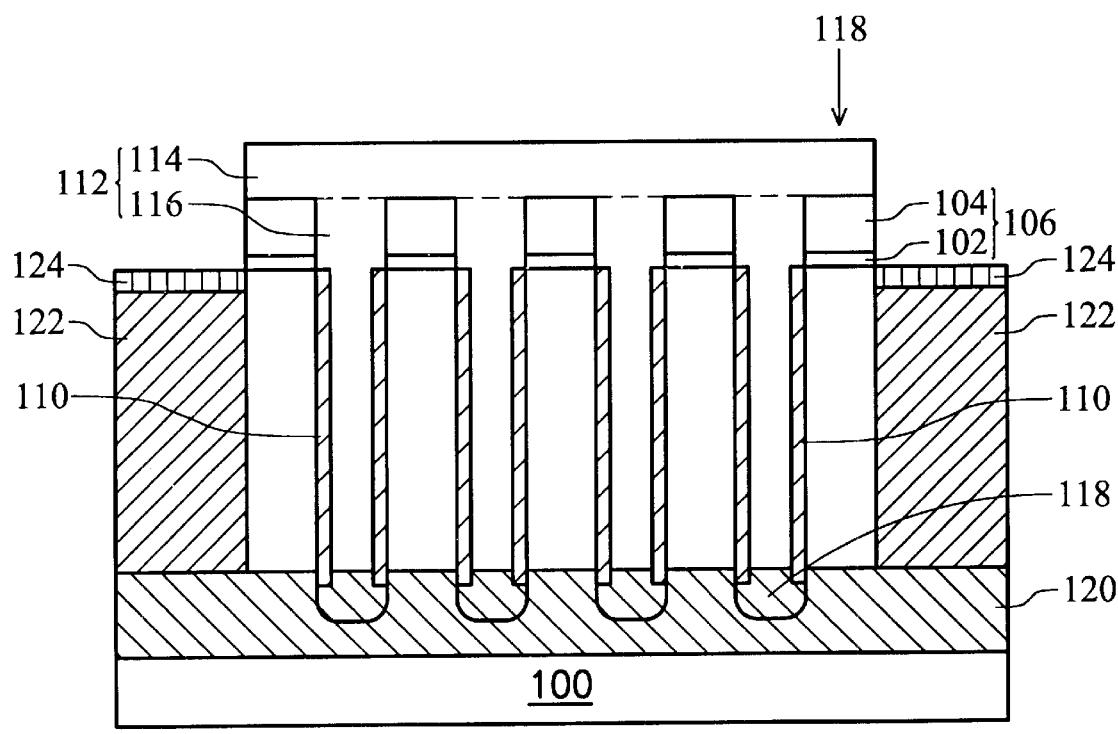

Subsequently, referring to FIG. 2D, a photoresist pattern (not shown) is formed on the polysilicon layer 112. Next, the semiconductor substrate 100 is doped with impurity ions using the photoresist pattern as a mask to form an N well 122. Doping can be performed by ion implantation to implant phosphorous ions or arsenic ions. Ion implantation to form the N well 122 can be performed in three stages. Implantation energy is 450 to 550 KeV at the first stage, 100 to 200 KeV at the second stage, and 150 to 250 KeV at the third stage. Finally, the semiconductor substrate 100 can be optionally doped at an energy of 15 to 25 KeV to form an Ohmic contact region 124. The photoresist pattern is then removed.

According to the present invention, measurement of the resistance of the deep trench is completed by means of two trenches of different depths. The structure shown in FIG. 2D is formed on a first substrate according to the above-mentioned process flow, with a first trench of depth $d_1$. The structure shown in FIG. 2D is formed on a second substrate according to the above-mentioned process flow, with a second trench of depth $d_2$ not equal to $d_1$.

Figure 3:
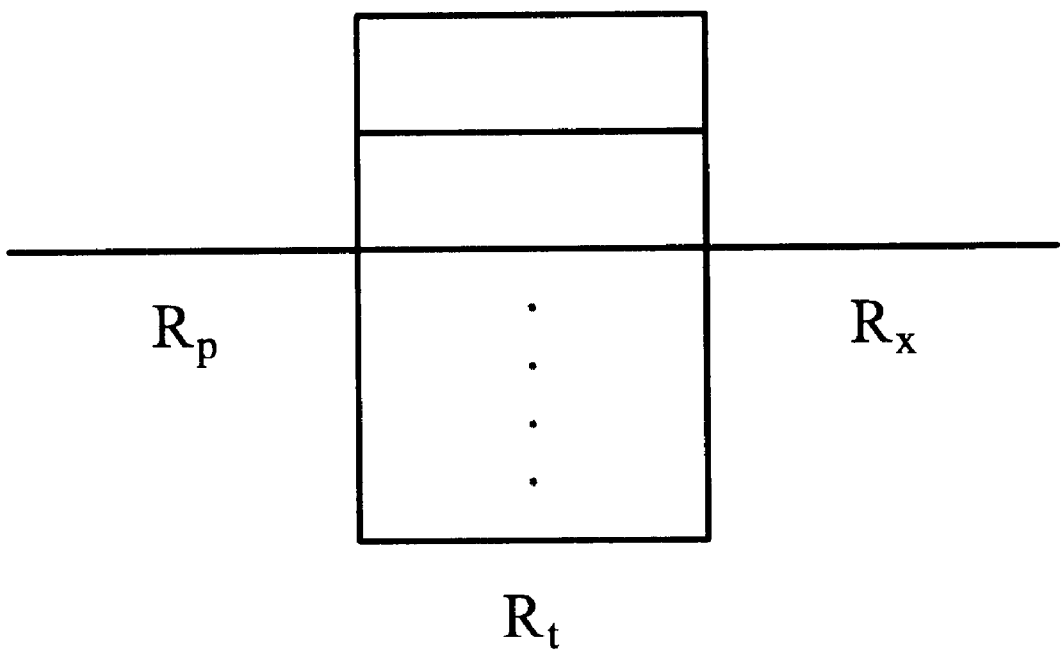
FIG. 3 shows an equivalent circuit diagram of a deep trench short loop.

The measurement method of the present invention is described below. FIG. 3 is an equivalent circuit diagram of a deep trench short loop, wherein Rp refers to the resistance of the polysilicon pad 114, Rt the resistance of the polysilicon plug 116 in the trench 108, and Rx the resistance of the doped interface of substrate

---

$Rt = 1/[(1/Rt_1) + (1/Rt_2) + \ldots + (1/Rt_{100000})]$, and $Rt_1 = Rt_2 = Rt_{100000}$
At depth $d_1$, $R_{Td1} = Rp + Rt_{d1} + Rx \ldots$ (1)
At depth $d_2$, $R_{Td2} = Rp + Rt_{d2} + Rx \ldots$ (2)
(1) − (2) $R_{Td1} − R_{Td2} = Rt_{d1} − Rt_{d2}$

---

(N well 122).

$R_T(\text{total resistance}) = Rp + Rt + Rx$

When there are 100000 parallel trenches, $Rt = 1/[(1/Rt_1) + (1/Rt_2) + \ldots + (1/Rt_{100000})]$, and $Rt_1 = Rt_2 = Rt_{100000}$ At depth $d_1$, $R_{Td1} = Rp + Rt_{d1} + RX$     (1)

At depth $d_2$, $R_{Td2} = Rp + Rt_{d2} + RX$     (2)

$R_{Td1} − R_{Td2} = Rt_{d1} − Rt_{d2}$     (1)−(2)

If $d_1 = kd_2$, k is a constant, then $Rt_{d1} = kRt_{d2}$ (when there is only one trench), and $Rt_{d1} = (1/k)Rt_{d2}$ (when there are a plurality of parallel trenches).

A voltage is applied to the polysilicon pad 114 and the semiconductor substrate 100 for both of the first and second substrates respectively. $R_{Td1}$ and $R_{Td2}$ can be measured. $Rt_{d1}$ and $Rt_{d2}$ can be obtained by calculation in turn.

The inventive method of measuring resistance of a deep trench has the following advantages. (1) The resistance of the polysilicon plug 116 in the deep trench and the resistance of polysilicon pad 114 can be measured by the present invention. (2) The measurement method of the present invention uses the presently used deep trench short loop, and there is no need to construct a new loop. (3) The inventive method immediately measures the resistance in the deep trench, which is beneficial to new processes and the development of next generation products. (4) No additional process or apparatus is needed.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of measuring resistance in a deep trench, comprising the following steps:

providing a first substrate having a first pad structure and a first trench with a first depth;

forming a first collar insulating layer on the sidewall of the first trench;

forming a first polysilicon layer in the first trench and on the first substrate, wherein the first polysilcion layer includes a first polysilicon pad on the first pad structure and a first polysilicon plug in the first trench;

doping the first polysilicon layer and the first substrate with impurity ions;

forming a first N well in the first substrate by doping with impurity ions;

providing a second substrate having a second pad structure and a second trench with a second depth, wherein the second depth is not equal to the first depth;

forming a second collar insulating layer on the sidewall of the second trench;

forming a second polysilicon layer in the second trench and on the second substrate, wherein the second polysilicon layer includes a second polysilicon pad on the second pad structure and a second polysilicon plug in the second trench;

doping the second polysilicon layer and the second substrate with impurity ions;

forming a second N well in the second substrate by doping with impurity ions;

applying a voltage to the first and second substrates respectively to obtain a first total resistance of the first substrate and a second total resistance of the second substrate; and converting the first total resistance and second total resistance by calculation to obtain a resistance of the first polysilicon plug and a resistance of the second polysilicon plug.

2. The method as claimed in claim 1, wherein the first and second substrates are silicon.

3. The method as claimed in claim 1, wherein each of the first and second pad structures includes a pad oxide layer and a pad nitride layer.

4. The method as claimed in claim 1, wherein the first and second collar insulating layers are oxide.

5. The method as claimed in claim 1, wherein the step of doping is conducted by ion implantation with phosphorus or arsenic ion.

6. A method of measuring resistance in a deep trench, comprising the following steps:

providing a first substrate having a first pad structure and a plurality of first parallel trenches with a first depth;

forming a first collar insulating layer on the sidewall of each first trench;

forming a first polysilicon layer in each first trench and on the first substrate, wherein the first polysilicon layer includes a first polysilicon pad on the first pad structure and a first polysilicon plug in each first trench;

doping the first polysilicon layer and the first substrate with impurity ions;

forming a first N well in the first substrate by doping with impurity ions;

providing a second substrate having a second pad structure and a plurality of second parallel trenches with a second depth, wherein the second depth is not equal to the first depth;

forming a second collar insulating layer on the sidewall of each second trench;

forming a second polysilicon layer in each second trench and on the second substrate, wherein the second polysilicon layer includes a second polysilicon pad on the second pad structure and a second polysilicon plug in each second trench;

doping the second polysilicon layer and the second substrate with impurity ions;

forming a second N well in the second substrate by doping with impurity ions;

applying a voltage to the first and second substrates respectively to obtain a first total resistance of the first substrate and a second total resistance of the second substrate; and converting the first total resistance and second total resistance by calculation to obtain a resistance of the first polysilicon plug and a resistance of the second polysilicon plug.

7. The method as claimed in claim 6, wherein the first and second substrates are silicon.

8. The method as claimed in claim 6, wherein each of the first and second pad structures includes a pad oxide layer and a pad nitride layer.

9. The method as claimed in claim 6, wherein each of the first and second collar insulating layers are oxide.

10. The method as claimed in claim 6, wherein the step of doping is conducted by ion implantation with phosphorus or arsenic ions.

* * * * *